(12) United States Patent
Sexton et al.

(10) Patent No.: US 8,475,624 B2
(45) Date of Patent: Jul. 2, 2013

(54) METHOD AND SYSTEM FOR DISTRIBUTING GAS FOR A BEVEL EDGE ETCHER

(75) Inventors: Greg Sexton, Fremont, CA (US); Andrew Bailey, III, Pleasanton, CA (US); Alan Schoen, Ben Lomond, CA (US)

(73) Assignee: Lam Research Corporation, Fremont, CA (US)

( * ) Notice: Subject to any disclaimer, the term of this patent is extended or adjusted under 35 U.S.C. 154(b) by 765 days.

(21) Appl. No.: 11/697,695

(22) Filed: Apr. 6, 2007

(65) Prior Publication Data

US 2008/0216864 A1 Sep. 11, 2008

Related U.S. Application Data

(63) Continuation-in-part of application No. 11/440,561, filed on May 24, 2006, now Pat. No. 7,909,960, which is a continuation-in- part of application No. 11/237,327, filed on Sep. 27, 2005, now abandoned.

(51) Int. Cl.
| | |
|---|---|
| *C23F 1/00* | (2006.01) |
| *H01L 21/306* | (2006.01) |
| *B44C 1/22* | (2006.01) |
| *C03C 15/00* | (2006.01) |
| *C03C 25/68* | (2006.01) |

(52) U.S. Cl.
USPC ............. 156/345.3; 156/345.43; 216/67

(58) Field of Classification Search
USPC ............. 156/345.32, 345.3, 345.43; 216/67
See application file for complete search history.

(56) References Cited

U.S. PATENT DOCUMENTS

| | | | | |
|---|---|---|---|---|
| 5,575,853 | A * | 11/1996 | Arami et al. .................. | 118/708 |
| 6,171,104 | B1 * | 1/2001 | Saito et al. ..................... | 432/18 |
| 6,471,830 | B1 * | 10/2002 | Moslehi et al. .......... | 204/192.12 |
| 6,837,967 | B1 * | 1/2005 | Berman et al. ............. | 156/345.3 |
| 2001/0009177 | A1 * | 7/2001 | Luo et al. ..................... | 156/345 |
| 2005/0036126 | A1 * | 2/2005 | Kubo .............................. | 355/72 |
| 2005/0173067 | A1 * | 8/2005 | Lim .......................... | 156/345.32 |
| 2005/0268849 | A1 * | 12/2005 | Ishida ........................... | 118/719 |
| 2006/0086461 | A1 | 4/2006 | Inada et al. | |
| 2007/0068900 | A1 | 3/2007 | Kim et al. | |

* cited by examiner

*Primary Examiner* — Keath Chen
(74) *Attorney, Agent, or Firm* — Martine Penilla Group, LLP

(57) ABSTRACT

A plasma etch processing chamber configured to clean a bevel edge of a substrate is provided. The chamber includes a bottom edge electrode and a top edge electrode defined over the bottom edge electrode. The top edge electrode and the bottom edge electrode are configured to generate a cleaning plasma to clean the bevel edge of the substrate. The chamber includes a gas feed defined through a top surface of the processing chamber. The gas feed introduces a processing gas for striking the cleaning plasma at a location in the processing chamber that is between an axis of the substrate and the top edge electrode. A pump out port is defined through the top surface of the chamber and the pump out port located along a center axis of the substrate. A method for cleaning a bevel edge of a substrate is also provided.

10 Claims, 5 Drawing Sheets

METHOD AND SYSTEM FOR DISTRIBUTING GAS FOR A BEVEL EDGE ETCHER

CROSS REFERENCE TO RELATED APPLICATION

This application is a continuation-in-part of U.S. patent application Ser. No. 11/237,327 filed on Sep. 27, 2005, and titled "Apparatus For The Removal Of A Set Of Byproducts From A Substrate Edge And Methods Therefor," now abandoned, and U.S. patent application Ser. No. 11/440,561 filed on May 24, 2006 now U.S. Pat. No. 7,909,960. The disclosure of these applications is incorporated herein by reference in their entirety for all purposes.

BACKGROUND

The present invention relates in general to substrate manufacturing technologies and in particular to apparatus and methods for the removal etch byproducts from a bevel edge and a backside of a substrate.

In the processing of a substrate, e.g., a semiconductor substrate (or wafer) or a glass panel such as one used in flat panel display manufacturing, plasma is often employed. During substrate processing, the substrate (or wafer) is divided into a plurality of dies, or rectangular areas. Each of the plurality of dies will become an integrated circuit. The substrate is then processed in a series of steps in which materials are selectively removed (or etched) and deposited. Control of the transistor gate critical dimension (CD) on the order of a few nanometers is a top priority, as each nanometer deviation from the target gate length may translate directly into the operational speed and/or operability of these devices.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and on the bottom surfaces of the substrate bevel edge. Typically, there are no dies present near the edge of the substrate, for example between about 2 mm to about 15 mm from the substrate edge. However, as successive byproduct polymer layers are deposited on the top and bottom surfaces of the bevel edge as a result of several different etch processes, organic bonds that are normally strong and adhesive will eventually weaken during subsequent processing steps. The polymer layers formed near the top and bottom surfaces of a substrate edge would then peel or flake off, often onto another substrate during substrate transport. For example, substrates are commonly moved in sets between plasma processing systems via substantially clean containers, often called cassettes. As a higher positioned substrate is repositioned in the container, byproduct particles (or flakes) may fall on a lower substrate where dies are present, potentially affecting device yield.

Etch byproducts can also be deposited on the backside of substrate support due to contamination or handling during the etching process. Since the substrate backside is not exposed to etching plasma, the byproduct polymer layer formed on the backside is not removed during subsequent etch processing steps. Therefore, the byproduct polymer layer can also accumulate on the substrate backside in a manner similar to the accumulation of polymer layer near the top and bottom surfaces of a substrate edge, and can result in particle problems. In addition, the interior of the process chamber, such as chamber walls, can also accumulate etch byproduct polymers, which needs to be removed periodically to avoid byproducts accumulation and chamber particle issues.

Dielectric films, such as SiN and $SiO_2$, and metal films, such as Al and Cu, can also be deposited on the bevel edge (including the top and bottom surfaces) and do not get removed during etching processes. These films can also accumulate and flake off during subsequent processing steps, thereby impacting device yield.

In view of the foregoing, there is a need for apparatus and methods that provide improved mechanisms of removal of etch byproducts, dielectric films and metal films near the substrate bevel edge, and etch byproducts on substrate backside and chamber interior to avoid accumulation of polymer byproducts and deposited films and to improve process yield.

SUMMARY

Broadly speaking, the embodiments fill the need by providing a method and system for cleaning a bevel edge of a wafer. It should be appreciated that the present invention can be implemented in numerous ways, including as a solution, a method, a process, an apparatus, or a system. Several inventive embodiments of the present invention are described below.

In one embodiment, a plasma etch processing chamber configured to clean a bevel edge of a substrate is provided. The chamber includes a bottom edge electrode surrounding a substrate support of the plasma processing chamber. The substrate support is configured to receive the substrate and the bottom edge electrode and the substrate support are electrically isolated from each other by a bottom dielectric ring. The chamber includes a top edge electrode defined over the bottom edge electrode. The top edge electrode and the bottom edge electrode are configured to generate a cleaning plasma to clean the bevel edge of the substrate. The chamber includes a gas feed defined through a top surface of the processing chamber. The gas feed introduces a processing gas for striking the cleaning plasma at a location in the processing chamber that is between an axis of the substrate and the top edge electrode. A pump out port is defined through the top surface of the chamber and the pump out port located along a center axis of the substrate. In an alternative embodiment, the gas feed is located through a bottom or a side of the processing chamber.

In another embodiment, a method for cleaning a bevel edge of a wafer is provided. The method initiates with flowing a process gas through one of a side region or a bottom region of a chamber. A plasma is generated with the process gas proximate to the bevel edge of the wafer and the chamber is pumped out through a top outlet of the chamber located along an axis of the wafer while flowing the process gas.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Several exemplary embodiments are disclosed, which define a method and system that selectively etches the bevel edge of the substrate, as well as providing a more efficient pump down and chamber pressure control. It should be appreciated that the present invention can be implemented in numerous ways, including as a process, a method, an apparatus, or a system. Several inventive embodiments of the present invention are described below. It will be apparent to those skilled in the art that the present invention may be practiced without some or all of the specific details set forth herein.

The embodiments described herein provide a system and method to etch a bevel edge region of a substrate while not etching, i.e., both chemical and physical types of etching, a center region of the top of the substrate. For systems with a center gas feed, it is suggested that the center gas flow provides the means to prevent radicals from coming into the center region. The embodiments described herein enable introduction of a processing gas through an off axis top port, a side port or a bottom port. A pump out port defined through the chamber top is provided and in one embodiment, the top pump out port is aligned with an axis of the substrate. In another embodiment, the chamber is configured to provide for more efficient pump-downs between processing operations, without sacrificing pressure control capabilities during the processing operations. This is achieved through a valve assembly having a main shut-off valve in parallel with a smaller throttle valve and corresponding smaller shut of valve included in a bypass around the main shut off valve.

Figure 1:
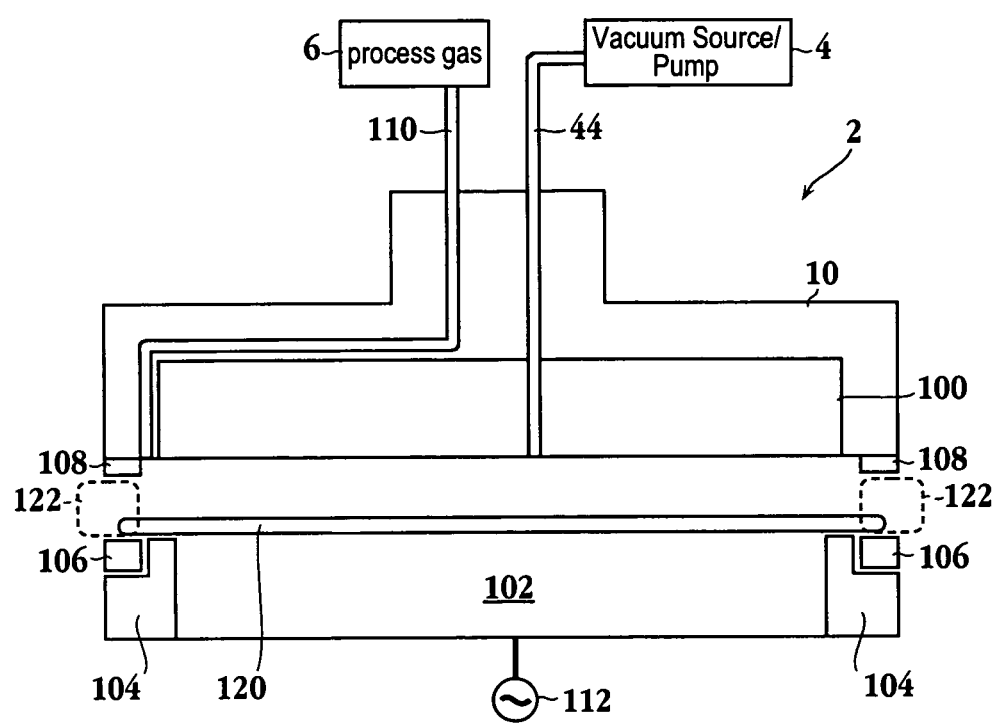
FIG. 1 is a simplified schematic diagram illustrating an exemplary cross section view of a processing chamber in accordance with one embodiment of the invention.

FIG. 1 is a simplified schematic diagram illustrating an exemplary cross section view of a processing chamber in accordance with one embodiment of the invention. In one embodiment, the processing chamber described herein is a bevel edge etching system where gas may be fed from various regions in order to etch the edge of a substrate or wafer disposed within the chamber. The etching of the edge region cleans this area from byproducts disposed thereon. Bevel edge etch chamber 2 includes a channel 44 through a center region of an upper electrode assembly 10 of the chamber top and allowing access into the reaction chamber where a wafer is processed. Channel 44 is connected at one end to vacuum supply/pump 4. Reaction chamber 2 includes top insulator block 100 disposed over bottom electrode 102, which is powered by radio frequency (RF) generator 112. It should be noted that bottom electrode 102 may also be referred to as a powered substrate support. Gas supply 110 will supply gas to a region proximate to the edge of wafer 120 from process gas supply 6. Top ground electrode 108 is disposed over a peripheral edge region of wafer 120, i.e., the bevel edge region of the wafer. Bottom ground electrode 106 is disposed under an edge region of wafer 120 and opposes top electrode 108. It should be appreciated that bottom electrode 106 and top electrode 108 are grounded in one embodiment. Dielectric 104 electrically isolates bottom electrode 106 from bottom electrode 102. Of course, electrodes 106 and 108 may be powered in another embodiment. Within region 122, a plasma is struck between electrodes 108 and 106. By applying a vacuum source, or a pump, to pump out from channel 44, the pressure gradient within reaction chamber 2 may be adjusted during the cleaning of the bevel edge.

While FIG. 1 illustrates the entry of the process gas in a location proximate to plasma region 122, the embodiments are not limited to this configuration. That is, the process gas can be introduced anywhere between an inner surface of electrode 108 and channel 44. One skilled in the art will appreciate that changing the entry location of the process gas through the top of the chamber, the pressure profile experienced by the substrate may be manipulated. In an alternative embodiment, an inert gas may be pumped through center feed/channel 44 of chamber 2 while a process gas is delivered to the outer periphery or edge region of the chamber which is proximate to the bevel edge of the wafer. Thus, the plasma would be struck in the edge region while the etch process gas is flowing and the inert gas flows into the center region. The flow rate of the inert gas in the center region may be used to manipulate a pressure experienced by the wafer similar to the pump out procedure described herein. Through the embodiments described herein, one exemplary pressure gradient may be defined as the center region of the wafer experiencing a pressure of about 50 Torr, while the outer edge of the wafer is exposed to a pressure of about 2 Torr. Of course this range can be reversed through the embodiments described above as channel 44 may be used to supply a gas to increase the pressure or channel 44 may be used to pump out the region of the chamber to reduce the pressure. One skilled in the art will appreciate that the distance from a top surface of wafer 122 and the bottom of insulator block 100 is about 4 millimeters in one embodiment, thus allowing the pressure gradients to exist.

Figure 2A:
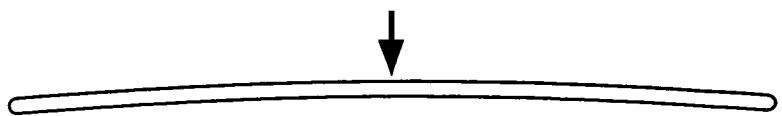
FIGS. 2A-2C illustrate exemplary configurations of substrates that may be accommodated through the manipulation of the pressure profile across the substrate.
Figure 2B:
Figure 2C:
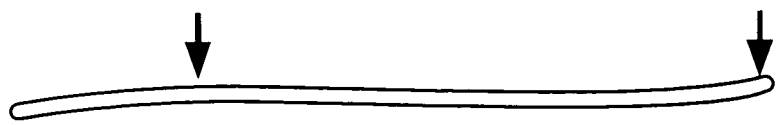

FIGS. 2A-2C illustrate exemplary configurations of substrates that may be accommodated through the manipulation of the pressure profile across the substrate. In FIG. 2A the wafer has a convex shape. Thus, the pressure experienced by the center region can be greater than the pressure on the edge region in order to flatten the wafer. Alternatively, if the wafer has a concave shape as illustrated by FIG. 2B, greater pressure may be applied along the edge region while pumping out of channel 44 to reduce the pressure on the center region in order to again flatten the wafer. The pressure differential zones within the chamber may be created by the location of the introduction of the processing gas into the reaction chamber and the rate at which gas in pumped out of channel 44. In one embodiment, the pump out rate may be adjusted to create concentric pressure gradients across the top surface of wafer in accordance with one embodiment. FIG. 2C illustrates a substrate that has both convex and concave warping. In this embodiment, a pressure gradient may be applied that forces a downward pressure as indicated by the arrows to flatten the substrate. By manipulating the application of channel 44 between a pump out port and a supply port, along with the location of the process gas, the various deformations of the wafer may be accommodated.

Figure 3A:
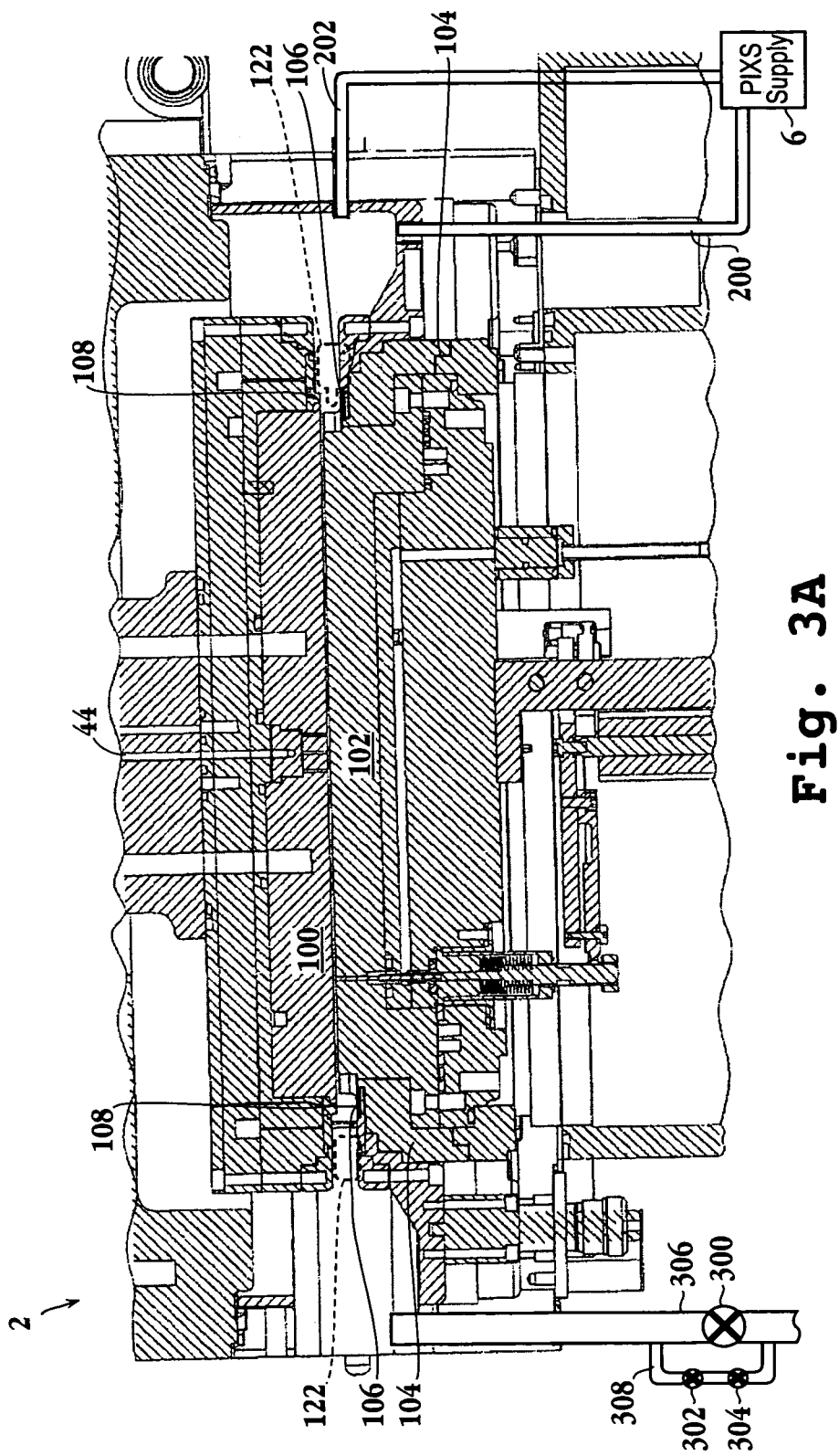
FIG. 3A is a simplified schematic diagram illustrating a reaction chamber having the capability of a bottom gas feed or a side gas feed in accordance with one embodiment of the invention.

FIG. 3A is a simplified schematic diagram illustrating a reaction chamber having the capability of a bottom gas feed or a side gas feed in accordance with one embodiment of the invention. Chamber 2 is illustrated as having bottom gas feed 200 which may be used to deliver a process gas from gas supply 6 to create a plasma in region 122, which is proximate to a bevel edge of a wafer to be processed. Ground electrodes 108 and 106, in conjunction with powered bottom electrode 102, may be used to create the plasma within region 122 from the process gas being delivered through bottom gas feed 200. Alternatively, side gas feed 202 may be used to introduce a process gas into region 122. Side gas feed 202 will deliver the process gas from gas supply 6 so that a plasma may be struck in region 122 to clean the bevel edge of a wafer disposed within reaction chamber 2. It should be appreciated that in these embodiments the gas feed line can be hard piped, i.e., no flex lines are needed, as is required when the gas is delivered through a chamber top. It should be appreciated that when gas is delivered through the chamber top, which is removable, the gas lines must be able to accommodate the removability of the chamber top. Furthermore, since gas feeds 202 and 200 are hard piped, the need for a filter to protect against particulates is eliminated. With flex lines a filter is required to be utilized to protect against particulates. This filter then becomes restrictive on a pump down rate. With the gas feeds at the side and/or bottom, this filter may be eliminated so that the pump down rate is not restricted. While both a side gas feed and a bottom gas feed are depicted in FIG. 3A, it should be noted that one or both may be included and the embodiments are not to be limited to both gas feeds being present.

FIG. 3A further includes a valve assembly for an improved technique for pumping down a chamber quickly and controlling a pressure in the chamber during processing more accurately in accordance with one embodiment of the invention. For a serial configuration of a shutoff valve and throttle valve, the throttle valve is sized the same as the shut off valve, which is relatively large in order to accommodate the pump down rate. However, the constriction on the throttle valve, i.e., the size limitation, causes the throttle valve to be substantially closed during processing. With the throttle valve substantially closed, due to the relatively large size, the amount of control exerted over the chamber pressure is restricted. The valve configuration of FIG. 3A enables the pump down of the chamber quickly, while allowing an optimally sized throttle valve for use during processing operations to better control the chamber pressure. In FIG. 3, shut off valve 300 is sized large in order to maintain a pump down rate. However, bypass line 308 in conjunction with throttle valve 302 and shutoff valve 304 avoid the need for a large shutoff valve. In this embodiment, throttle valve 302 and shutoff valve 304 define a parallel bypass to shut off valve 300, which may be used during processing so that throttle valve 302 may control the process more effectively. That is, throttle valve 302 is sized accordingly so that the throttle valve is maintained in a "sweet spot" for pressure control, i.e., open near the middle of the operating range of the valve. Thus, when pumping down, shutoff valve 300 will be used to maintain a fast pump down rate through line 306 which has a larger diameter. When processing, shutoff valve 304 and throttle valve 302 are used to control the process. Thus, when processing, shutoff valve 300 is in an off position, while shutoff valve 304 and throttle valve 302 are open. Conversely, when pumping down the chamber shutoff valve 300 is open, while throttle valve 302 and shutoff valve 304 are closed, or at least shut off valve 304 is closed in one embodiment. One skilled in the art will appreciate that the valves may be controlled through a controller, that similarly controls the introduction of the process gas from corresponding gas feeds.

Figure 3B:
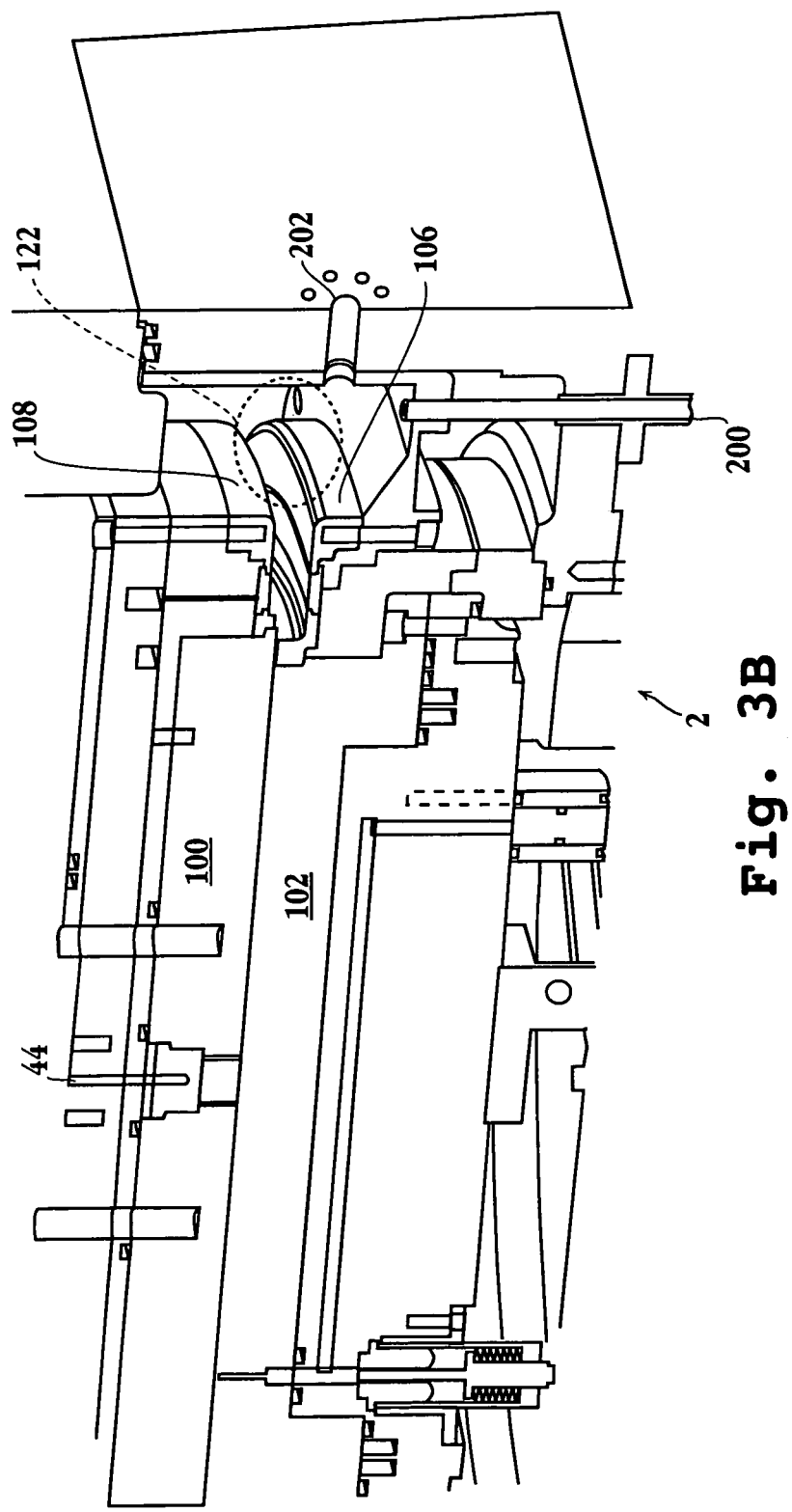
FIG. 3B is a perspective view illustrating a reaction chamber having the capability of a bottom gas feed or a side gas feed in accordance with one embodiment of the invention.

FIG. 3B is a perspective view illustrating a reaction chamber having the capability of a bottom gas feed or a side gas feed in accordance with one embodiment of the invention. As illustrated, chamber 2 includes powered substrate support 102 and top insulator block 100. A top pump out port 44 is defined within insulator block 100. Electrodes 106 and 108 are annular rings defined below and above, respectively, the bevel edge region of a substrate being processed. Feed gas supplies 200 and 202 supply gas from a bottom region of the chamber and a side region of the chamber, respectively. The gas is supplied in the vicinity of region 122, where a plasma is generated from the feed gas to clean the bevel edge of a wafer. It should be appreciated that while a single feed line is illustrated for each of feed supplies 200 and 202, the embodiments are not limited to this structure. For example, feed supplies 200 and 202 may supply a plenum that configured to deliver a supply gas uniformly around the outer peripheral region of electrodes 106 and 108. In one embodiment, the plenum is an annular ring having holes distributed along an outer surface to evenly distribute the process gas is defined within this region accomplishes this functional requirement.

Figure 4:
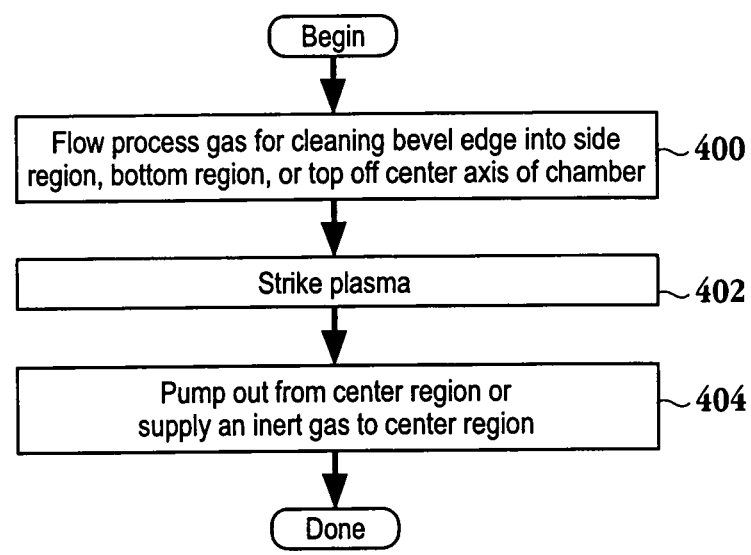
FIG. 4 is a flow chart diagram illustrating the method operations for processing the bevel edge of a wafer in accordance with one embodiment of the invention.

FIG. 4 is a flow chart diagram illustrating the method operations for processing the bevel edge of a wafer in accordance with one embodiment of the invention. The method initiates with operation 400 where a process gas flows into either a side region or a bottom region of the chamber. It should be appreciated that the process gas is hard piped into the process chamber as illustrated in FIGS. 3A and 3B. It should be noted that the process gas may be provided from a top region that is between an axis of the wafer being processed and the peripheral edge of the wafer as discussed above with regard to FIG. 1. A plasma is generated from the process gas in operation 402, where the plasma is proximate to an outer peripheral region of the wafer, i.e., the bevel edge of the wafer. Exemplary process gases and combinations of process gases for performing the bevel edge cleaning are provided in U.S. application Ser. Nos. 11/237,327 and 11/440,561. While flowing the gas into either of the side or bottom regions, the chamber is pumped out from a center region above the wafer to be processed as specified in operation 404. Alternatively, an inert gas may be pumped into the center region as mentioned above with reference to FIG. 1. As described with regard to FIGS. 1 and 2A-2C, the pump out of the chamber from the center region can be used to manipulate or affect a pressure gradient across the wafer surface in order to correct any deformations in the wafer. That is, if the wafer is bowed or curved, the pressure gradient may be adjusted in order to manipulate the wafer so the wafer is flattened to assist in the processing uniformity.

It should be appreciated that the embodiments described herein in any of the Figures may be integrated together. For example, the parallel shut off/throttle valve configuration of FIGS. 3A and 3B may be incorporated with the configuration of FIG. 1. In addition, the center pump out may be integrated with a side or bottom gas feed. Thus, through the different combinations an optimal processing configuration may be designed depending on the user's preference.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A plasma etch processing chamber configured to clean a bevel edge of a substrate, comprising:
    a bottom edge electrode surrounding a substrate support of the plasma processing chamber, wherein the substrate support is configured to receive the substrate; the bottom edge electrode and the substrate support are electrically isolated from each other by a bottom dielectric ring;
    a top edge electrode defined over the bottom edge electrode, the top edge electrode and the bottom edge electrode are configured to generate a cleaning plasma to clean the bevel edge of the substrate;
    an inductive coil surrounding the bevel edge of the substrate, wherein the top and bottom electrodes are grounded when the inductive coil generates a plasma;
    a gas feed defined through a side surface of the processing chamber, the gas feed introducing a processing gas for striking a plasma defined between the top edge electrode and the bottom edge electrode; and
    a pump out port defined through a top surface of the chamber, the pump out port located at a radial distance from a center axis of the substrate, wherein a distance of an inlet of the pump out port from a top surface of a substrate is about 4 mm thereby enabling pressure gradients to exist over a top surface of the substrate to substantially flatten a warped substrate during cleaning of the bevel edge.

2. The etch processing chamber of claim 1, wherein the gas feed defined through the side surface provide a single point of entry for the processing gas into a region below the bottom electrode.

3. The etch processing chamber of claim 1, further comprising a vacuum source connected to the pump-out port.

4. The etch processing chamber of claim 1, further comprising:
    a radio frequency generator supplying power to the substrate support.

5. The etch processing chamber of claim 1, wherein the gas feed defined through the side surface is hard-piped into the chamber, thereby eliminating flexible tubing.

6. The etch processing chamber of claim 1, wherein the bottom edge electrode and the top edge electrode are grounded annular rings and wherein the gas feed introduces the processing gas into an annular ring having an inner diameter greater than an outer diameter of the grounded annular rings.

7. The etch processing chamber of claim 1, including a pump out port defined through a bottom surface, the pump out port defined through the bottom surface including a valve assembly with a first valve having a first size and a second and a third valve in parallel with the first valve, wherein the second and the third valve have a second size, the second size being smaller than the first size.

8. The etch processing chamber of claim 7, wherein the first valve is closed during processing operations and the second and third valves are open during the processing operations.

9. The etch processing chamber of claim 7, where the first valve is opened for pumping down the chamber between processing operations and the second and third valves are closed when pumping down the chamber between the processing operations.

10. The etch processing chamber of claim 1, wherein the pump out port defined through the top surface is controlled to switch between pumping out the chamber and introducing an inert gas into the chamber.

* * * * *